United States Patent [19]
Cath et al.

[11] 3,787,776
[45] Jan. 22, 1974

[54] HIGH SPEED CURRENT AMPLIFIER

[75] Inventors: Pieter G. Cath, Orange Village; Gary E. Angeline, Euclid, both of Ohio

[73] Assignee: Keithley Instruments, Inc., Solon, Ohio

[22] Filed: Oct. 6, 1971

[21] Appl. No.: 186,922

[52] U.S. Cl. .................... 330/2, 330/97, 330/149, 330/207 P, 330/103
[51] Int. Cl. .................... H03f 19/00
[58] Field of Search .................... 330/31, 149, 192, 2

[56] References Cited

UNITED STATES PATENTS

| | | | |
|---|---|---|---|
| 2,970,276 | 1/1961 | Dollinger | 330/149 X |
| 3,550,013 | 12/1970 | Gurol | 330/149 X |
| 3,408,585 | 10/1968 | Greeson, Jr. et al. | 330/21 X |

OTHER PUBLICATIONS

Applications Manual for Operational Amplifiers–Philbrick/Nexus Research – A Teledyne Co. 1968. P. 37.I.50.

*Primary Examiner*—Nathan Kaufman

[57] ABSTRACT

A high speed current amplifier is disclosed for purposes of amplifying current signals from a current source over a wide frequency band while minimizing generated noise. The amplifier employs amplifying circuitry having an input adapted to be connected to a current source and an output, with the amplifying circuitry exhibiting an open loop gain of A. A resistive feedback path is employed, which exhibits a resistance R, connected between the input and output so that the amplifying circuitry would normally exhibit a useful band width extending to roll-off frequency $F_1$ where $F_1 = A/(2\pi RC)$, with C being the shunt capacitance across the amplifier input. An attenuator is connected to the output of the amplifier for purposes of attenuating high frequency noise components above frequency $F_2$, where $F_2$ is less than frequency $F_1$ and at a rate greater than that of a single roll-off.

2 Claims, 9 Drawing Figures

INVENTORS
PIETER G. CATH
GARY E. ANGELINE
BY Yount and Tarolli
ATTORNEYS

INVENTORS
PIETER G. CATH
GARY E. ANGELINE
BY Yount and Tarolli
ATTORNEYS

INVENTORS
PIETER G. CATH
GARY E. ANGELINE
BY Yount and Tarolli
ATTORNEYS

HIGH SPEED CURRENT AMPLIFIER

This invention relates to the art of amplifiers and, more particularly, to an improved amplifier particularly applicable for amplifying small currents over a wide frequency band while minimizing generated noise.

The invention is particularly applicable in conjunction with measuring instruments, such as picoammeters, for accurately measuring small currents over a wide frequency band and will be described with particular reference thereto; although, it is to be appreciated that the invention has broader applications and may be used in various applications requiring amplification of current signals over wide frequency bands.

It is known that the band width of a current amplifier may be increased by employing an operational amplifier having a current feedback path. The feedback path may employ the measuring resistor and the amplifier may be characterized by having a shunt input capacitance which limits the total system band width. Such circuits, however, provide three sources of generated noise; to wit, shot noise, current noise from the measuring resistor, and voltage noise from the amplifier input. Shot noise is the current noise from the amplifier input and is essentially associated with the leakage current of the input device. Shot noise and the current noise from the measuring resistor are both white noise, and are independent of the input shunt capacitance. Thus, these two noise sources generate noise which is substantially constant over the frequency band.

The invention herein is based, to a large extent, on the observation that the major source of noise in high speed current measurements is due to the noise associated with the voltage noise of the input amplifier. This noise, as will be demonstrated herein, is not independent of frequency but, to the contrary, at high frequencies the noise increases with intensity. Consequently, when such an amplifier is configured so as to increase its band width a substantial increase in noise is obtained. Such noise should be minimized so as to not adversely affect the accuracy of measurements made with instrumentation connected to the amplifier's output.

The primary object of the present invention is to provide a high speed amplifier having increased band width while minimizing the generation of high frequency noise.

A still further object of the present invention is to provide an improved high speed, wide band current amplifier which employs circuitry for attenuating high frequency noise components.

A still further object of the present invention is to provide a high speed, wide band amplifier particularly applicable for use in conjunction with amplifying low level signals over a wide frequency band while minimizing high frequency noise due to amplifier input voltage.

A still further object of the present invention is to minimize the noise generated by the voltage input to an operational amplifier having a current feedback path without varying the circuitry of the feedback path.

A still further object of the present invention is to provide an improved high speed current amplifier having a wide band width while minimizing generated noise with the provision of a separate filter amplifier.

In accordance with the present invention the amplifier includes amplifying means having an input adapted to be connected to a current source and an output which exhibits an open loop gain of A. A resistive feedback path is employed having resistance R connected between the input and output of the amplifying circuit so that the amplifying circuit exhibits a useful band width extending to a roll-off frequency $F_1$, wherein $F_1 = A/(2\pi RC)$ and wherein C is the total shunt capacitance across the input of the amplifying circuit. Attenuating circuitry is connected to the output for purposes of attenuating high frequency noise components above a frequency $F_2$, which is less than frequency $F_1$ and at a rate greater than six decibels per frequency octave.

In accordance with a more limited aspect of the invention, the attenuating circuitry includes circuitry for attenuating the high frequency components at a rate equal to twelve decibels per frequency octave.

In accordance with a still further aspect of the present invention, the attenuating circuitry includes a low pass active filter having components configured to provide attenuation of high frequency components at a roll-off of twelve decibels per frequency octave.

The foregoing and other objects and advantages of the invention will become more readily apparent from the following description of the preferred embodiment of the invention taken in conjunction with the accompanying drawings which are a part hereof and wherein.

Figure 3:
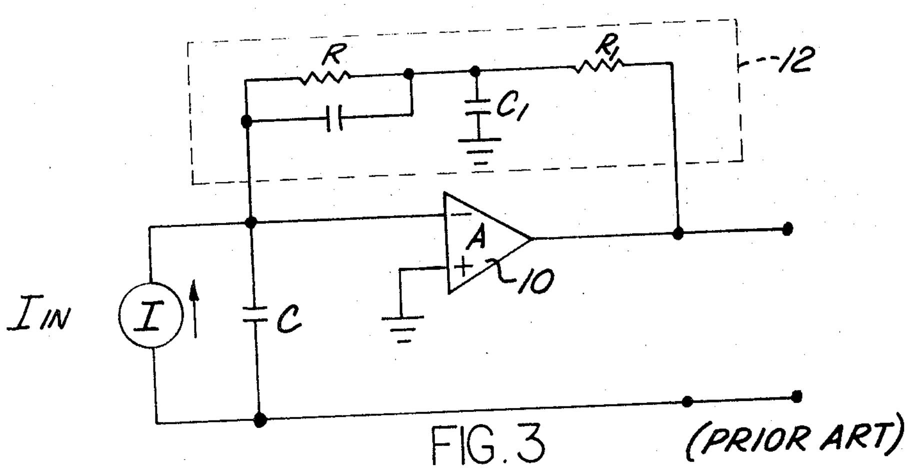
FIG. 3 (PRIOR ART)
FIG. 3 is a schematic illustration of a still further prior art current amplifier.
Figure 4:
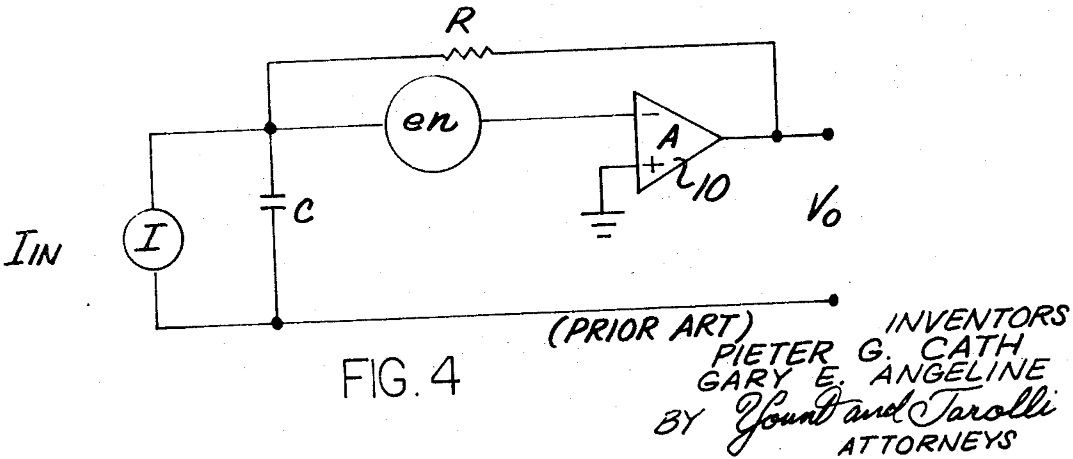
FIG. 4 (PRIOR ART)
FIG. 4 is a schematic illustration of the input voltage noise generator in a prior art current amplifier.

Before describing the circuitry employed in the present invention, as more particularly depicted in FIGS. 8 and 9, reference will be made to the circuits illustrated in FIGS. 1, 3 and 4 and the graphical illustrations for purposes of presenting pertinent background to the present invention.

When small currents are measured, it is frequently necessary that they be amplified to a level suitable for use with appropriate measuring instrumentation. Current is typically measured in terms of the voltage drop across a known resistor. The voltage drop may be amplified; however, the band width is limited by the RC time constant associated with the high megohm resistor employed. The band width may be increased for higher sensitivity in measurements if the measuring resistor be decreased in value and the gain of the amplifier be increased. This approach, however, drastically increases generated noise since current noise increases as a function of the square root of the inverse value of the resistor. Thus, decreasing the value of the measuring resistor will increase current noise.

Figure 1:
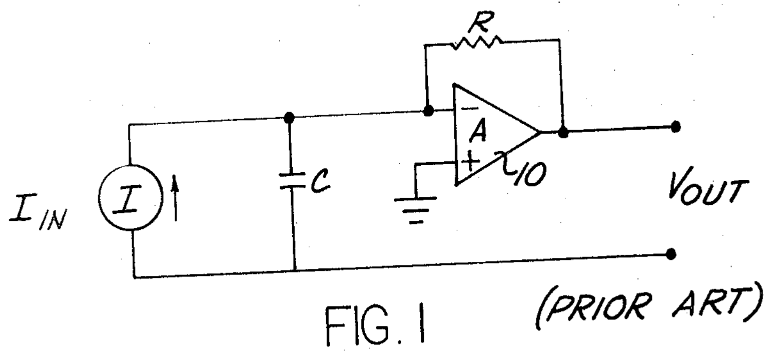
FIG. 1 (PRIOR ART)
FIG. 1 is a schematic illustration of a prior art current amplifier.
Figure 2:
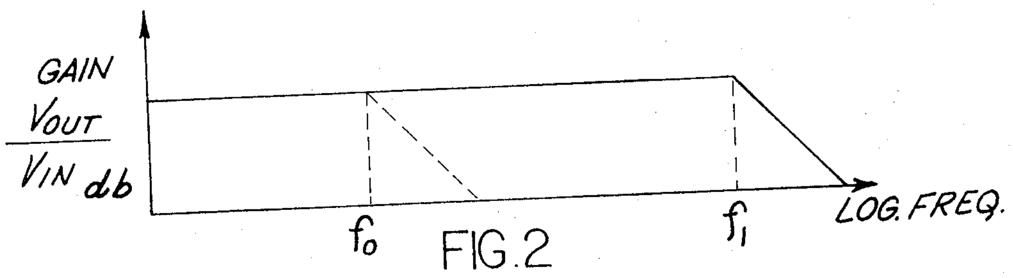
FIG. 2 is a graphical illustration of gain versus logarithmic frequency of the circuit shown in FIG. 1.

It has been known to increase the band width by employing current feedback techniques along the lines illustrated in FIG. 1. Here, the measuring resistor R is placed in the feedback loop of an inverting operational amplifier 10, having an open loop gain equal to A. The total shunt capacitance across the amplifier 10 is indicated by capacitor C and the current source is shown by legend $I_{in}$. The frequency response of this circuit as associated with the RC time constant is: $F_0 = ½\pi RC$) and this frequency response is shown by the first roll-off in FIG. 2. The usefal band width of the amplifier circuit of FIG. 1 is extended by the gain A of the amplifier so that the frequency response is extended to a frequency $F_1$, where $F_1 = A\ F_0$. This feedback technique permits the band width of a current amplifier to be increased to frequency $F_1$ while avoiding generation of excessive current noise with lower values of the measuring resistor R. However, the total band width of such a system is limited by the shunt capacitance C.

A major disadvantage of the feedback system of FIG. 1 arises from the shunt capacitance associated with the feedback resistor R. If this shunt capacitance be represented by $C_F$ then the band width $F_F$ of the system will be determined by the time constant $RC_F$ or:

$$F_F = 1/2\pi RC_F$$

This response may be increased by a slight correction in the feedback path. Thus, as shown in FIG. 3, an additional feedback resistor $R_1$ and a capacitor $C_1$ is included in the feedback path with the parameters being chosen so that the time constant $R_1C_1$ is equal to the time constant $RC_F$. This circuit, as shown within the dotted lines 12 of FIG. 3, behaves as a resistance R and the circuit is redrawn in FIG. 4 including a noise source $e_N$ to be discussed in greater detail below.

Three sources of noise are associated with the circuits discussed thus far. These noise sources include shot noise, current noise from the measuring resistor, and voltage noise from the amplifier input. The shot noise is the current noise from the amplifier input and is associated with the gate leakage current of the input device. This noise increases as a function of the square root of the product of the leakage current and the electronic charge. The current noise from the measuring resistor increases in proportion to the square root of the inverse value of the feedback resistor R. Consequently, for low noise the feedback resistor R must be made large. Both of these noise sources generate white noise and the noise is independent of the input shunt capacitance C and, hence, these sources of noise are relatively stable over the frequency band.

Figure 5:
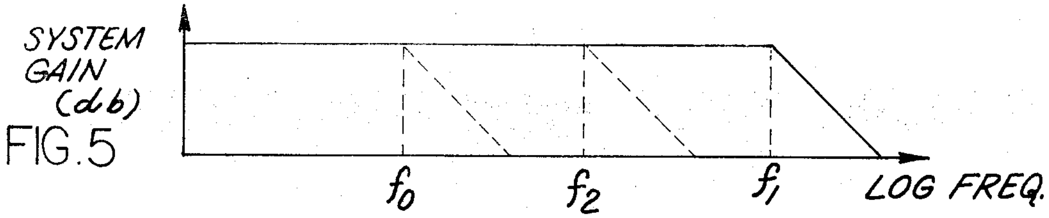
FIG. 5 is a graphical illustration of amplifier system gain with respect to logarithmic frequency used in conjunction with the description of the invention herein.

When the frequency response of such an amplifier is increased beyond the frequency $F_0$ associated with the RC time constant, the major source of generated noise is that associated with the voltage noise of the input amplifier. This noise may be indicated by noise generator $e_N$, shown in FIG. 4. The noise generator itself may be assumed to be white, however, the total noise contribution to the current measuring system is not white. From an inspection of the circuit of FIG. 4, it will be noted that at low frequencies a large amount of feedback is applied around voltage noise source $e_N$. The RC circuit however attenuates the high frequency components of the output voltage $V_0$ so that no feedback is present at high frequencies. Consequently, the noise contribution to the output voltage from the noise source $e_N$ is not independent of frequency but, instead, the noise is "colored" and increases in intensity for all frequencies higher than frequency $F_0$. This is shown by the noise spectrum in FIG. 6 wherein the total system noise is shown by the area under curve 20. Thus, even though the system gain has been extended to a frequency $F_1$ (see the graph in FIG. 5) substantial noise is generated due to noise source $e_N$ at all frequencies beyond frequency $F_0$. At the high frequency end the voltage noise is limited by a frequency $F_A$ which is the high frequency roll-off point for operational amplifier 10 and this frequency, as dictated by the components of the amplifier, should be greater than frequency $F_1$.

Figures 6, 7:
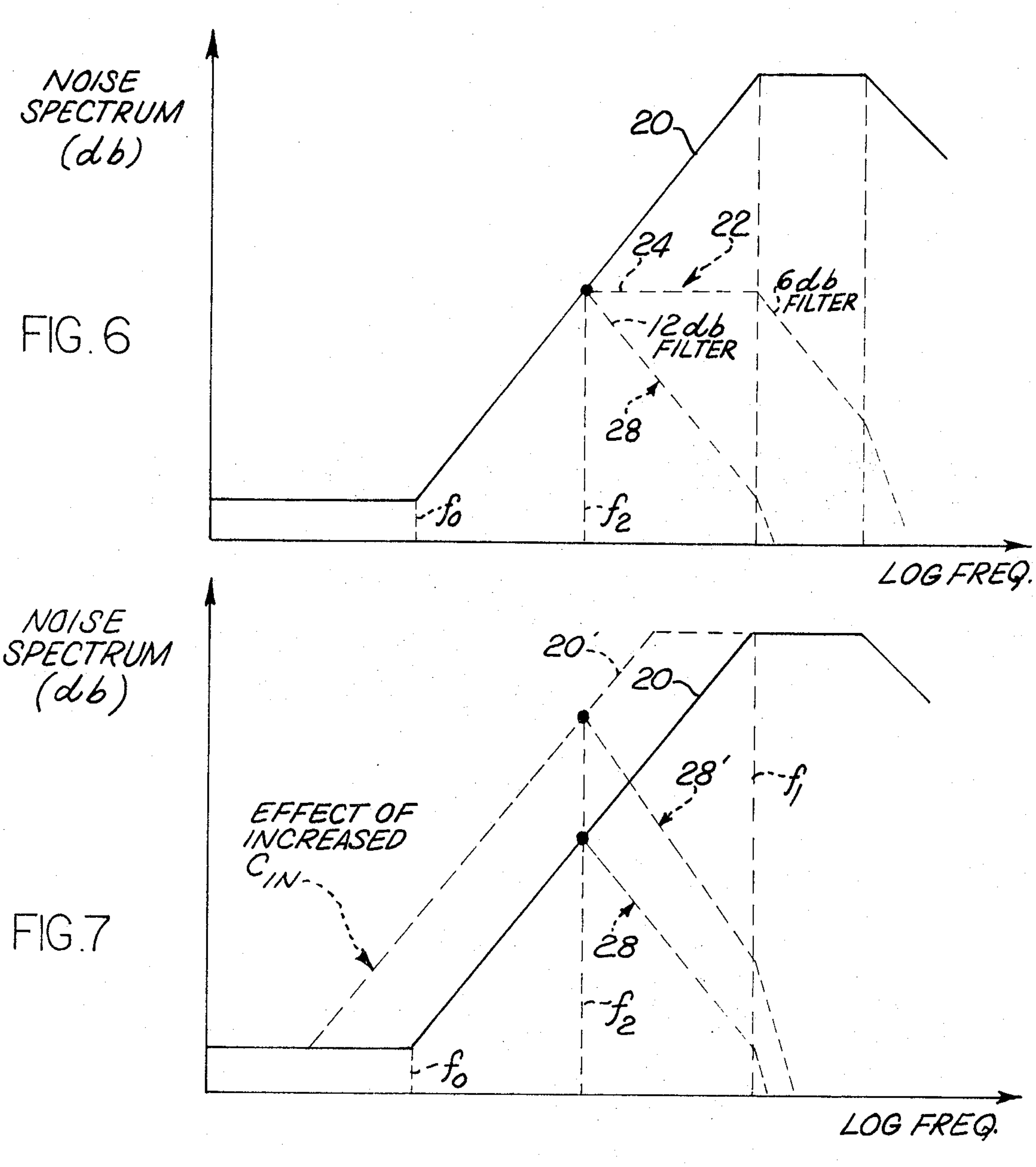
FIG. 6 is a graphical illustration of the noise spectrum with respect to logarithmic frequency and which is used in conjunction with the description of the invention herein.
FIG. 7 is another graphical illustration similar to that of FIG. 6 but showing the effect of increased shunt capacitance.

In accordance with the present invention the band width of such a current amplifier is limited to a frequency $F_2$, less than that of frequency $F_1$, by an attenuator or filter section, and in doing so noise components beyond frequency $F_2$ are attenuated at a rate dependent upon the characteristics of the filter employed. In FIG. 6, curve 22 illustrates the effect on the noise spectrum if the filter attenuates noise at a rate of six decibels per octave. Since the noise throughout the frequency band is represented by the area under curve 22 it will be noted that there still remains substantial high frequency noise beyond frequency $F_2$, the useful band width of the system. The first portion 24 of curve 22 is relatively flat since curve 20 increases at a rate of +6 db. per octave and, hence, attenuation at a rate of −6 db. per octave will merely provide a flat noise spectrum response. However, once curve 20 flattens at its high frequency end, curve 22 will decrease at a rate of −6 db. per octave. In a preferred form of the present invention, the attenuation commencing at frequency $F_2$ is at a rate of −12 db. per octave so that, as shown by the dotted line 28 in FIG. 6, substantially more high frequency noise is eliminated than that which is obtained with a −6 db. filter. If the value of the shunt capacitance C is increased in level then the frequency at which the noise spectrum increases in level will be less than frequency $F_0$, as shown by the dotted line 20' in FIG. 7. In such case, the use of a −12 db. filter eliminates high frequency noise as shown by the dotted line 28'. Thus, an increase in input capacitance C will result in more noise and the same effect is obtained by adding capacitance across the feedback resistor R which has, in the past, been frequently availed of for purposes of limiting signal band width. Since the same effect as increased capacitance C is obtained by adding capacitance across resistor R it is seen that for a low noise performance signal band width, attenuation of noise should be accomplished with a separate filter section.

Figure 8:
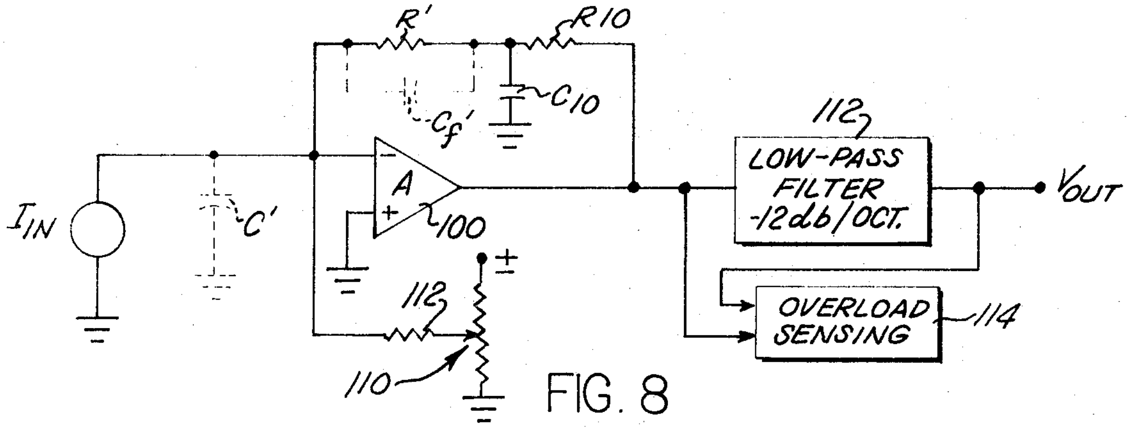
FIG. 8 is a simplified schematic-block diagram illustration of the present invention; and, FIG. 9 is a more detailed schematic-block diagram illustration of the present invention.

Referring now to FIG. 8, there is shown a block diagram illustration of apparatus which may be employed in practicing the present invention. This high speed current amplifier employs an inverting amplifier 100 taking the form of a wide band, high gain, field effect transistor input operational amplifier. Junction field effect transistors are presently preferred rather than MOS field effect transistors to minimize voltage noise of the input device. Amplifier 100 is provided with a feedback path which employs a measuring feedback resistor R' having an effective shunt capacitance $C_F'$. Like the circuit shown in FIG. 3, a compensating RC network is provided, including resistor $R_{10}$ and capacitor $C_{10}$. The input shunt capacitance is indicated by capacitor C'. Current suppression is afforded by the use of a potentiometer 110 having a wiper arm connected through a resistor 112 to the summing point of the operational amplifier. The output circuit of operational amplifier 110 is connected to a low pass filter 112 which exhibits a −12 db. per octave roll-off and a voltage gain of 10. This voltage gain avoids premature loading in the input amplifier. The maximum output voltage is set to swing between +10 volts and −10 volts and the maximum signal level at the input of the filter 112 is set to swing between +1 volt and −1 volt. The voltage gain in the filter 112 permits the total prefilter wide band filter noise to exceed the full scale signal by a factor of twenty decibels.

This circuitry minimizes noise as shown by curve 28 in FIG. 6, or for increased shunt capacitance by the curve 28′ in FIG. 7. An overloading sensing circuit 114 is employed for purposes of monitoring the overload conditions at both the input to the low pass filter 112 and the output thereof.

Figure 9:
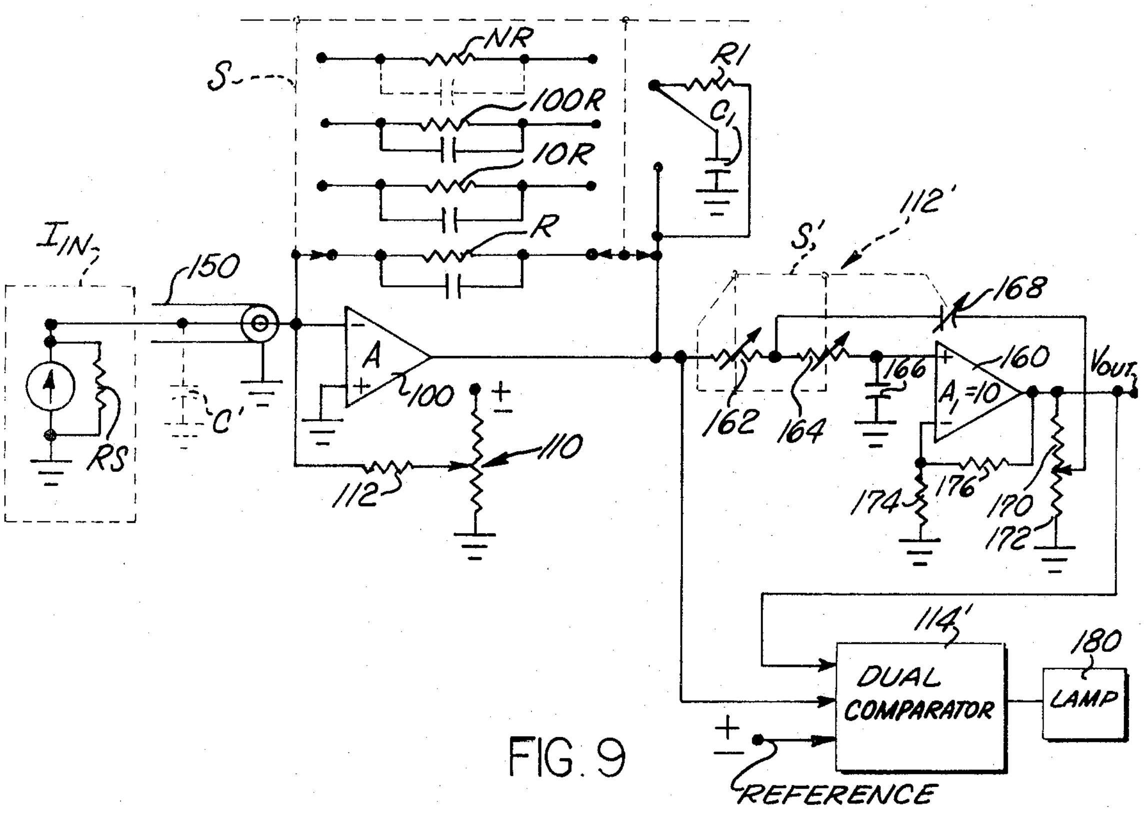

The invention may be further implemented as shown by the schematic-block diagram illustration of FIG. 9, wherein a cable conductor 150 is connected from the current source $I_{in}$ to the inverting input of amplifier 100. The internal resistance of the source is shown by the legend $R_S$ and the total shunt capacitance for amplifier 100 is shown by capacitor C′. A range switch S is shown for purposes of connecting different RC feedback circuits across amplifier 100 depending on the level of sensitivity desired. The low pass filter takes the form of an active filter 112′ which includes noninverting operational amplifier 160 exhibiting a gain of 10 together with adjustable circuit components including resistors 162, 164 and capacitors 166 and 168 for forming the − 12 db. filter section. These adjustable resistors and components are shown in a simplified fashion in FIG. 9, and it is to be appreciated that in a commercial version various discrete components will be used and switched as with a suitable switching mechanism S′. The capacitance feedback path is taken from a point between series connected output resistors 170 and 172 to the junction of resistors 162 and 164. The inverting input of the amplifier is connected to ground through a resistor 174 as well as through a resistor 176 to the output of the amplifier.

The input to the filter-amplifier 112′, as well as the output thereof, are applied to a dual comparator 114′ which compares each voltage signal with a reference and if the voltage signal is greater than the reference a suitable visual readout or lamp 180 is energized.

Although the description has been given with respect to a preferred embodiment, it is to be appreciated that the invention is not limited thereto as various modifications and arrangements in parts may occur to those skilled in the art within the scope and spirit of the appended claims.

What is claimed is:

1. A high speed current amplifier for amplifying current signals from a current source over a wide frequency band while minimizing noise, and comprising:
  amplifying means having an input adapted to be connected to a said source and an output and exhibiting an open loop gain of A,
  a resistive feedback path exhibiting a resistance R connected between said input and said output so that said amplifying means would normally exhibit a useful band width extending to a roll-off frequency $F_1$, where:

$$F_1 = A/(2\pi RC)$$

and C is the shunt capacitance across said input,
  attenuating means connected to said output for attenuating high frequency noise components above frequency $F_2$, where $F_2$ is less than $F_1$ and at a rate greater than six decibels per frequency octave, and
  comparing means for comparing the output signal from said attenuating means with a reference signal and providing an output indication in dependence upon said comparison.

2. A high speed current amplifier for amplifying current signals from a current source over a wide frequency band while minimizing noise, and comprising:
  amplifying means having an input adapted to be connected to a said source and an output and exhibiting an open loop gain of A,
  a resistive feedback path exhibiting a resistance R connected between said input and said output so that said amplifying means would normally exhibit a useful band width extending to a roll-off frequency $F_1$, where:

$$F_1 = A/(2\pi RC)$$

and C is the shunt capacitance across said input,
  attenuating means connected to said output for attenuating high frequency noise components above frequency $F_2$, where $F_2$ is less than $F_1$ and at a rate greater than six decibels per frequency octave, and
  dual comparator means for comparing both the input signal to said attenuating means with a reference signal as well as the output signal of said attenuating means with a reference signal and providing an output indication in dependence upon at least one of said comparisons.

* * * * *